(12) United States Patent
Takimoto et al.

(10) Patent No.: US 10,394,017 B2
(45) Date of Patent: Aug. 27, 2019

(54) ACTUATOR DEVICE AND MIRROR DRIVE DEVICE

(71) Applicant: HAMAMATSU PHOTONICS K.K., Hamamatsu-shi, Shizuoka (JP)

(72) Inventors: Sadaharu Takimoto, Hamamatsu (JP); Masakuni Kimoto, Hamamatsu (JP); Norihide Adachi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/634,296

(22) Filed: Jun. 27, 2017

(65) Prior Publication Data
US 2017/0293136 A1 Oct. 12, 2017

Related U.S. Application Data

(63) Continuation of application No. 14/908,173, filed as application No. PCT/JP2013/083362 on Dec. 12, 2013, now Pat. No. 9,729,038.

(30) Foreign Application Priority Data

Aug. 1, 2013 (JP) ................................. 2013-160425

(51) Int. Cl.
*G02B 26/08* (2006.01)
*H02K 33/18* (2006.01)
(Continued)

(52) U.S. Cl.
CPC .......... *G02B 26/085* (2013.01); *B81B 3/0045* (2013.01); *G02B 26/0816* (2013.01);
(Continued)

(58) Field of Classification Search
CPC .......................... G02B 26/085; G02B 26/0833; B81B 3/0045; B81B 2201/042; B81B 2203/0154; H02K 33/18
(Continued)

(56) References Cited

U.S. PATENT DOCUMENTS

| 2010/0245966 A1* | 9/2010 | Yasuda | G02B 26/0858 |
| | | | 359/224.1 |
| 2013/0301103 A1* | 11/2013 | Aimono | G02B 26/08 |
| | | | 359/224.1 |
| 2015/0168714 A1* | 6/2015 | Abele | G02B 26/0833 |
| | | | 359/200.7 |

FOREIGN PATENT DOCUMENTS

| JP | 2001-051224 | 2/2001 |
| JP | 2003-100753 A | 4/2003 |

(Continued)

OTHER PUBLICATIONS

International Preliminary Report on Patentability dated Feb. 11, 2016 for PCT/JP2013/083362.

*Primary Examiner* — Euncha P Cherry
(74) *Attorney, Agent, or Firm* — Drinker Biddle & Reath LLP

(57) ABSTRACT

An actuator device includes a support portion; a first movable portion; a first torsion bar portion coupling the first movable portion to the support portion to be swingable around a first swing axis; and a wiring disposed on the first torsion bar portion. The torsion bar portion is of a meandering shape including a plurality of straight sections extending in a first direction along the first swing axis and juxtaposed in a second direction intersecting with the first direction, and a plurality of turnover sections alternately coupling two ends of the straight sections. The plurality of
(Continued)

turnover sections have a curved shape. The wiring includes wiring sections embedded in grooves formed in the turnover sections.

9 Claims, 13 Drawing Sheets

(51) Int. Cl.
*B81B 3/00* (2006.01)
*G02B 26/10* (2006.01)

(52) U.S. Cl.
CPC ........... *G02B 26/101* (2013.01); *H02K 33/18* (2013.01); *B81B 2201/042* (2013.01); *B81B 2203/0154* (2013.01); *G02B 26/0858* (2013.01)

(58) Field of Classification Search
USPC ...................................................... 359/224.1
See application file for complete search history.

(56) References Cited

FOREIGN PATENT DOCUMENTS

| | | |
|---|---|---|
| JP | 2005-245135 | 9/2005 |
| JP | 2010-098905 A | 4/2010 |
| JP | 2012-088487 A | 5/2012 |
| JP | 2012-123364 A | 6/2012 |
| JP | 2012-163939 | 8/2012 |
| WO | WO 03/071331 | 8/2003 |
| WO | WO 2012/130612 | 10/2012 |

\* cited by examiner

ACTUATOR DEVICE AND MIRROR DRIVE DEVICE

This is a continuation application of copending application Ser. No. 14/908,173, having a § 371 date of Jan. 28, 2016, which is a national stage filing based on PCT International Application No. PCT/JP2013/083362, filed on Dec. 12, 2013. The copending application Ser. No. 14/908,173 is incorporated by reference herein in its entirety.

TECHNICAL FIELD

The present invention relates to an actuator device and a mirror driving device.

BACKGROUND ART

Known actuator devices include a support portion, a movable portion with a coil thereon, a magnetic field generating portion is configured to let a magnetic field be exerted on the coil, and torsion bar portions on which wiring connected to the coil is disposed and that couple the movable portion to the support portion so as to be swingable (e.g., cf. Patent Literature 1). The torsion bar portions are of a meandering shape including a plurality of straight sections and a plurality of turnover sections. The plurality of straight sections extends in a first direction along a swing axis of the torsion bar portions and is juxtaposed in a second direction intersecting with the first direction. The plurality of turnover sections alternately couples two ends of the plurality of straight sections.

CITATION LIST

Patent Literature

Patent Literature 1: Japanese Unexamined Patent Publication No. 2012-088487

SUMMARY OF INVENTION

Technical Problem

An object of the present invention is to provide an actuator device and a mirror driving device capable of achieving reduction in resistance of the wiring and preventing the wiring from inhibiting swing motion of the movable portion.

Solution to Problem

The Inventors conducted investigation research and found the new fact as described below.

When the torsion bar portions are of the aforementioned meandering shape, the wiring disposed on the torsion bar portions includes wiring sections disposed on the respective turnover sections and wiring sections connected to the foregoing wiring sections and disposed on the respective straight sections. The wiring sections disposed on the turnover sections have higher resistance than the wiring sections disposed on the straight sections, because of their shape. For this reason, the wiring sections disposed on the turnover sections have high resistance in the entire wiring. With high resistance of wiring, the wiring generates heat and it becomes difficult to ensure a sufficient amount of electric current to be supplied to the coil. If the sufficient amount of electric current to the coil is not ensured, a swing range of the movable portion decrease.

By adopting a configuration in which the wiring is damascene wiring made of copper (Cu), it is possible to significantly decrease the total resistance of the wiring disposed on the torsion bar portions. However, when the wiring is the damascene wiring made of Cu, the wiring may inhibit the swing motion of the movable portion.

In the case of the torsion bar portions of the meandering shape as described above, when the movable portion swings around the swing axis of the torsion bar portions, high stress is exerted on the straight sections extending in the first direction along the swing axis of the torsion bar portions. For this reason, for example, when the movable portion swings in one direction around the swing axis of the torsion bar portions, the high stress is exerted on the damascene wiring of Cu located on the straight sections, so as to cause plastic deformation of the damascene wiring of Cu itself. In the plastic deformation state of the wiring (damascene wiring), the movable portion could fail to return to an initial position, or, the movable portion could be subjected to mechanical resistance during swing motion in the direction opposite to the foregoing one direction around the swing axis of the torsion bar portions.

The Invertors conducted elaborate research on configurations capable of achieving reduction in resistance of the wiring and preventing the wiring from inhibiting the swing motion of the movable portion.

As a result of the research, the Inventors have come to discover a configuration capable of suppressing the plastic deformation. of the wiring sections located on the straight sections. In this configuration, the wiring sections disposed on the straight sections where the high stress is exerted on are not the damascene wiring Made of Cu, but they are wiring made of a metal material more resistant to plastic deformation than Cu.

The Inventors focused on the point that the stress exerted on the turnover sections is lower than that on the straight sections. The Inventors have come to consider that the resistance of the wiring could be reduced by adopting a configuration in which the wiring sections disposed on the turnover sections were the damascene wiring made of Cu. The wiring sections disposed on the turnover sections have relatively high resistance because of their shape, as described above. For this reason, when the wiring sections disposed on the turnover sections are the damascene wiring made of Cu, the resistance of the wiring can be kept low.

An actuator device according to one aspect of the present invention includes a support portion, a movable portion on which a conductor is disposed, and a torsion bar portion on which wiring connected to the conductor is disposed and that couples the movable portion to the support portion so as to be swingable. The torsion bar portion is of a meandering shape including a plurality of straight sections extending in a first direction along a swing axis of the torsion bar portion and juxtaposed in a second direction intersecting with the first direction, and a plurality of turnover sections alternately coupling two ends of the straight sections. The wiring includes first wiring sections disposed on the respective turnover sections and second wiring sections connected to the first wiring sections and disposed on the respective straight sections. The first wiring sections include damascene wiring sections that are disposed so as to be embedded in grooves formed in the turnover sections and that are made of a first metal material including Cu. The second wiring sections are disposed on the straight sections and are made of a second metal material more resistant to plastic deformation than the first metal material.

In the actuator device according to the one aspect of the present invention, the first wiring sections disposed on the turnover sections include the damascene wiring sections made of the first metal material including Cu. For this reason, it is feasible to achieve reduction in resistance of the wiring disposed on the torsion bar portion. The second wiring sections disposed on the straight sections are made of the second metal material more resistant to plastic deformation than the first metal material. For this reason, the plastic deformation of the second wiring sections is suppressed even in a situation where high stress is exerted on the straight sections. Therefore, it is feasible to prevent the wiring disposed on the torsion bar portion from inhibiting the swing motion of the movable portion.

The first wiring section may further include a section that is disposed on the damascene wiring section so as to cover an opening of the groove and that is made of the second metal material. In this case, the resistance of the first wiring section can be further reduced.

In the damascene wiring section, the corner edges located on the surface side of the turnover section may be locally thinned so as to reduce the sectional area because of steps in its manufacturing process. The decrease in sectional area of the damascene wiring section leads to increase in resistance of the first wiring section. However, since the first wiring section includes the section disposed on the damascene wiring section so as to cover the opening of the groove, the increase in resistance of the first wiring section can be prevented even if the damascene wiring section is thinned.

A connection point between the torsion bar portion and the support portion and a connection point between the torsion bar portion and the movable portion may be located on a virtual line passing through a central region in the second direction of the torsion bar portion and extending in the first direction.

The resonance frequency of the torsion bar portion is determined by the width of the torsion bar portion and the length in the first direction of the torsion bar portion. A conceivable configuration to decrease the stress exerted on the straight sections is to increase the number of straight sections. The straight sections are not juxtaposed in the first direction but juxtaposed in the second direction. For this reason, there is no change in the length in the first direction of the torsion bar portion, even with increase in the number of straight sections. Therefore, it facilitates design of the torsion bar portion for setting the resonance frequency of the torsion bar portion to a desired value.

The torsion bar portion may further include a first connection section that connects the support portion to one straight section located outermost in the second direction out of the plurality of straight sections, and a second connection section that connects the movable section to the other straight section located outer most in the second direction out of the plurality of straight sections, and the wiring may further include third wiring sections that are connected to the first wiring sections and that are disposed on the first and second connection sections, respectively.

The third wiring sections may include damascene wiring sections that are disposed so as to be embedded in grooves formed in the first and second connection sections, respectively, and that are made of the first metal material. In this case, even though the wiring includes the third wiring sections, increase in resistance of the wiring is suppressed. As a result, the reduction in resistance of the wiring can be surely achieved.

The second metal material may include Al or an alloy containing Al. In this case, plastic deformation of the second wiring sections can be suppressed quite well.

The movable portion may include a first section to which the torsion bar portion is coupled, and a second section supported on the first section so as to be swingable around a swing axis extending in a direction orthogonal to the swing axis of the torsion bar portion. In this case, the second section of the movable portion can be swung around each of the two orthogonal axes.

A coil as the conductor may be disposed on the movable portion, and the actuator device may further include a magnetic field generating portion is configured to let a magnetic field be exerted on the coil. In this case, the movable portion can be swung by letting an electric current flow through the coil on which the magnetic field is exerted.

A mirror driving device according to one aspect of the present invention is a mirror driving device including the foregoing actuator device and a mirror disposed on the movable portion.

The mirror driving device according to the one aspect of the present invention can achieve reduction in resistance of the wiring disposed on the torsion bar portion and can prevent the wiring disposed on the torsion bar portion from inhibiting the swing motion of the movable portion, as described above.

Advantageous Effects of Invention

According to the above-described aspects of the present invention, the actuator device and the mirror driving device are provided as those capable of achieving the reduction in resistance of the wiring and preventing the wiring from inhibiting the swing motion of the movable portion.

DESCRIPTION OF EMBODIMENTS

Embodiments of the present invention will be described below in detail with reference to the accompanying drawings. It is noted that in the description the same elements or elements with the same functionality will be denoted by the same reference signs, without redundant description.

Figure 1:
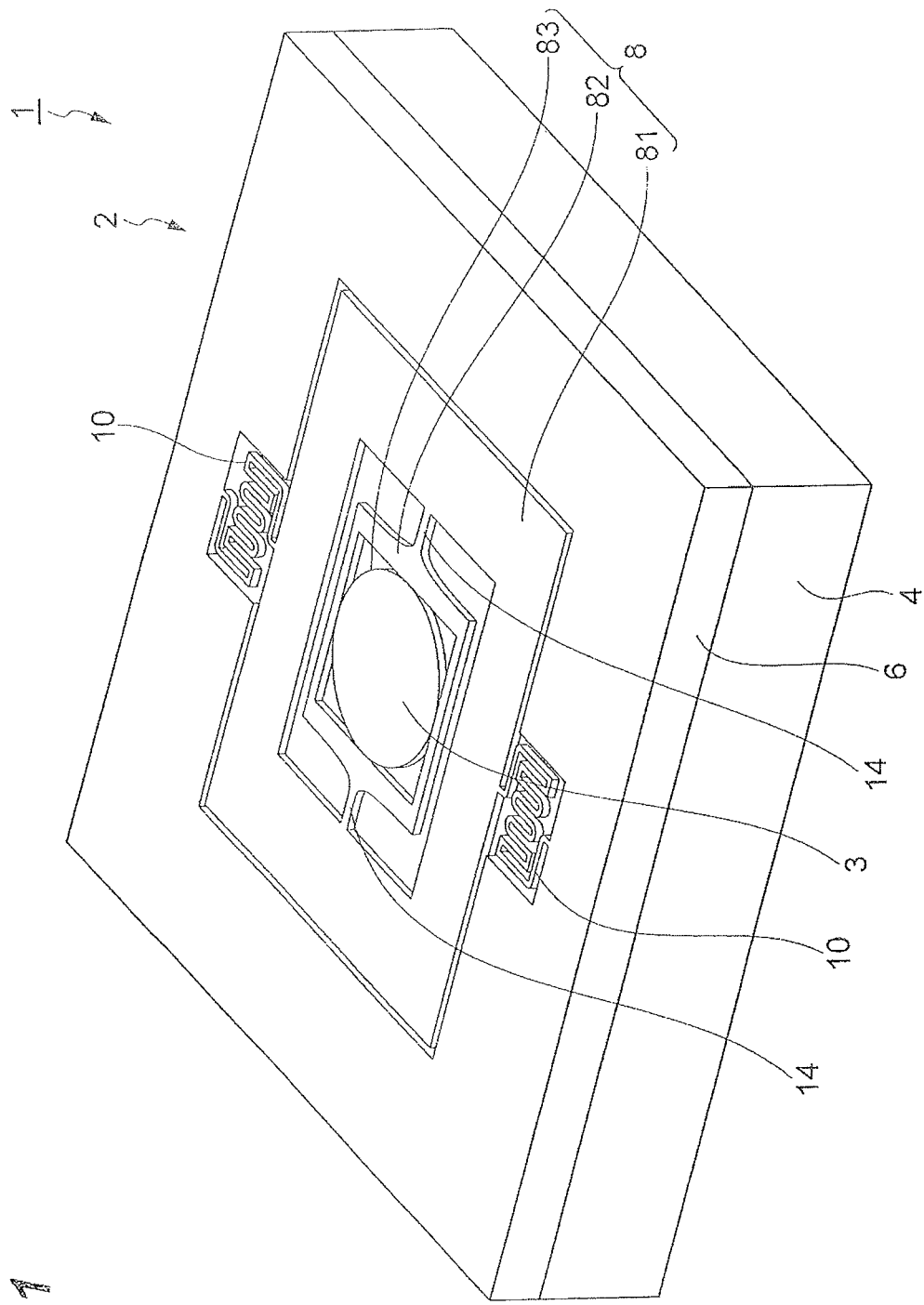
FIG. 1 is a perspective view showing a mirror driving device according to one embodiment of the present invention.
Figure 2:
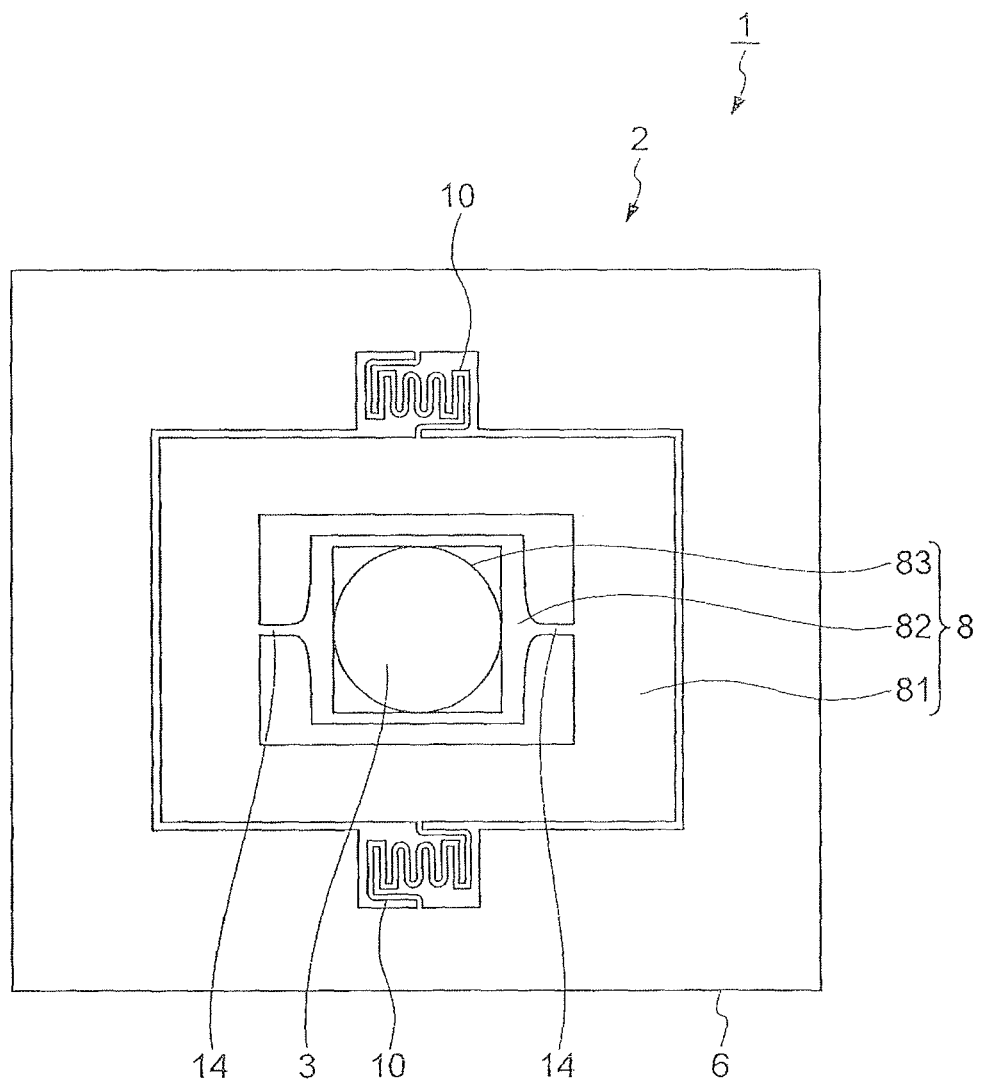
FIG. 2 is a top plan view of the mirror driving device shown in FIG. 1.
Figure 3:
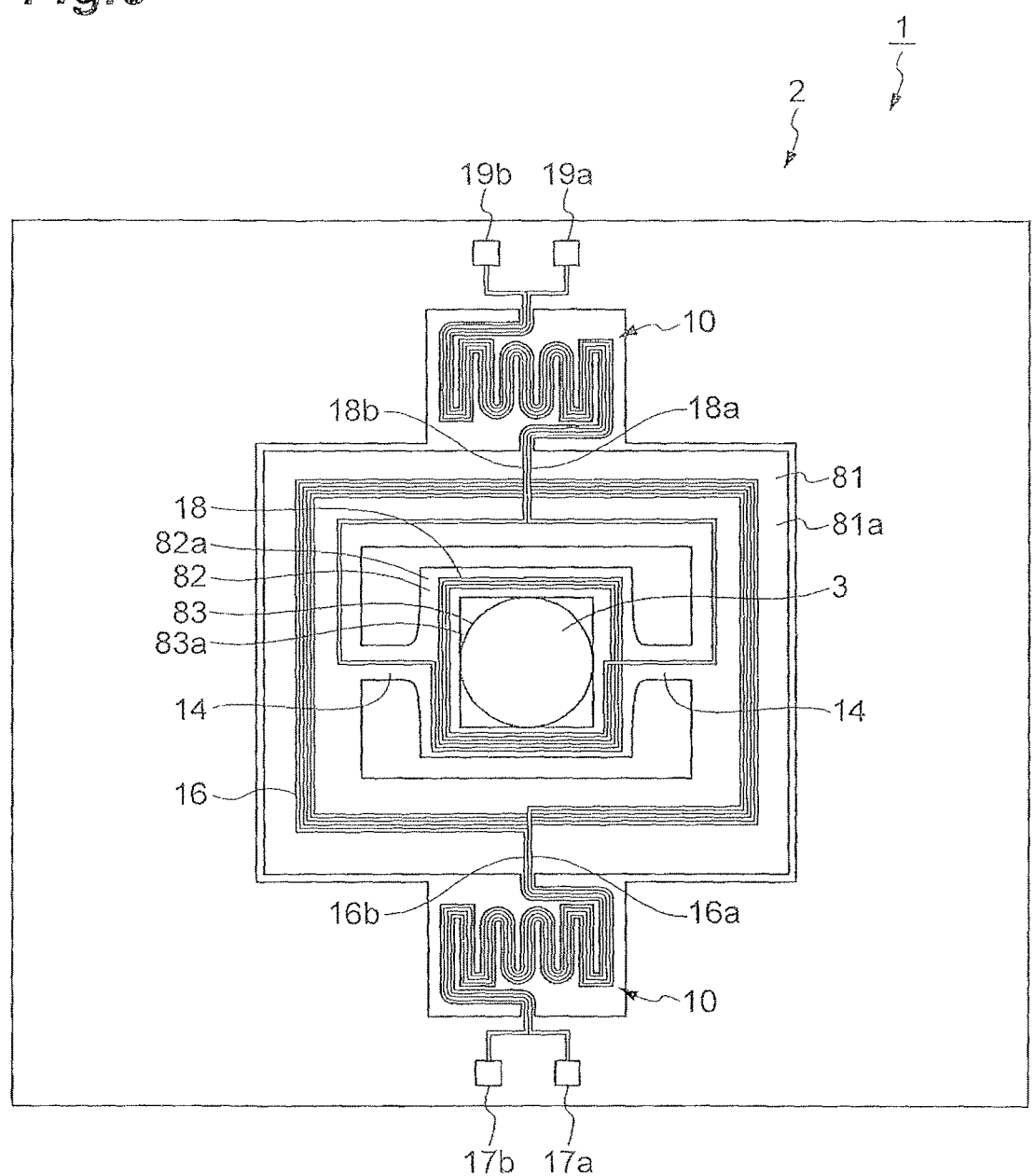
FIG. 3 is a drawing for illustrating a circuit in the mirror driving device shown in FIG. 1.

A configuration of a mirror driving device 1 according to the present embodiment will be described with reference to FIGS. 1 to 3. FIG. 1 is a perspective view showing the mirror driving device according to the present embodiment. FIG. 2 is a top plan view of the mirror driving device shown in FIG. 1. FIG. 3 is a drawing for illustrating a circuit in the Mirror driving device shown in FIG. 1.

As shown in FIGS. 1 to 3, the mirror driving device 1 includes an actuator device 2 and a mirror 3. The actuator device 2 includes a magnetic field generating portion 4, a support portion 6, a movable portion 8, and a pair of torsion bar portions 10.

The mirror 3 is a light reflecting film constituting a metal thin film. The mirror 3 is of a circular shape on its planar view. A metal material to be used for the mirror 3 can be, for example, aluminum (Al), gold (Au), or silver (Ag).

The magnetic field generating portion 4 is a flat plate of a rectangular shape. The magnetic field generating portion 4 includes a pair of principal faces 4a, 4b (not shown). The magnetic field generating portion 4 lets a magnetic field be exerted on the movable portion 8. Arrangement of magnetic poles adopted for the magnetic field generating portion 4 is a Halbach array. The magnetic field generating portion 4 is made, for example, of permanent magnets or the like.

The support portion 6 is a frame body with an outside contour of a rectangular shape. The support portion 6 is disposed on the magnetic field generating portion 4 so as to be opposed to the principal face 4a thereof. The support portion 6 supports the movable portion 8 through the pair of torsion bar portions 10. The movable portion 8 is located inside the support portion 6. The movable portion 8 includes a first movable portion 81, a second movable portion 82, and a mirror arrangement portion 83. In the present embodiment, the support portion 6, movable portion 8, and torsion bar portions 10 are integrally formed and are made, for example, of silicon (Si).

The first movable portion 81 is located inside the support portion 6 and is a frame body of a flat plate shape with an outside contour of a rectangular shape. The first movable portion 81 is coupled to the torsion bar portions 10 and is disposed as separated from the support portion 6. The first movable portion 81 is supported so as to be swingable on the support portion 6 through the pair of torsion bar portions 10. Namely, the first movable portion 81 is supported so as to be rotatable back and forth on the support portion 6 through the pair of torsion bar portions 10. Each torsion bar portion 10 couples the first movable portion 81 to the support portion 6 so as to be swingable. The first movable portion 81 includes a principal face opposed to the magnetic field generating portion 4, and a principal face 81a that is a back side with respect to the foregoing principal face. Each torsion bar portion 10 is of a meandering shape, as described below.

The second movable portion 82 is located inside the first movable portion 81 and is a frame body of a flat plate shape with an outside contour of a rectangular shape. The second movable portion 82 is disposed as separated from the first movable portion 81. The second movable portion 82 is supported so as to be swingable on the first movable portion 81 through a pair of torsion bar portions 14. Namely, the second movable portion 82 is supported so as to be rotatable back and forth on the first movable portion 81 through the pair of torsion bar portions 14. Each torsion bar portion 14 couples the second movable portion 82 to the first movable portion 81 so as to be swingable. The second movable portion 82 also includes a principal face opposed to the magnetic field generating portion 4, and a principal face 82a that is a back side with respect to the foregoing principal face as the first movable portion 81 includes. Each torsion bar portion 14 is of a straight shape and is located on an identical straight line. In the present embodiment, the torsion bar portions 14 are also formed integrally with the support portion 6, movable portion 8, and torsion bar portions 10 and are made, for example, of Si.

A swing axis of the torsion bar portions 10 intersects with a swing axis of the torsion bar portions 14. In the present embodiment, the swing axis of the torsion bar portions 10 is orthogonal to the swing axis of the torsion bar portions 14. Namely, a rotational axis of the torsion bar portions 10 intersects with a rotational axis of the torsion bar portions 14. The second movable portion 82 is supported on the first movable portion 81 so as to be swingable around the swing axis extending in the direction orthogonal to the swing axis of the torsion bar portions 10.

The mirror arrangement portion 83 is located inside the second movable portion 82 and is of a circular shape. The mirror arrangement portion 83 is integrated with the second movable portion 82 and swung integrally with the second movable portion 82. The minor arrangement portion 83 includes a principal face opposed to the magnetic field generating portion 4 and a principal face 83a that is a back side with respect to the foregoing principal face. The mirror 3 is disposed on the principal face 83a of the mirror arrangement portion 83.

The actuator device 2 (mirror driving device 1), as also shown in FIG. 3, includes a coil 16 disposed on the first movable portion 81 and a coil 18 disposed on the second movable portion 82. The coil 16 is disposed on the principal face 81a side of the first movable portion 81. The coil 18 is disposed on the principal face 82a side of the second movable portion 82. In the present embodiment, the coil 16 is used as a conductor disposed on the first movable portion 81 and the coil 18 is used as a conductor disposed on the second movable portion 82.

The coil 16 is wound in a spiral form of multiple turns when viewed from a direction orthogonal to the principal face 81a. One end of the coil 16 is located outside the coil 16 and the other end of the coil 16 inside the cod 16. One end of a lead conductor 16b is electrically connected to an outside end of the coil 16. One end of a lead conductor 16a is electrically connected to an inside end of the coil 16.

The lead conductors 16a, 16b are disposed mainly on one torsion bar portion 10 and extend from the first movable portion 81 to the support portion 6. The other ends of the lead conductors 16a, 16b are electrically connected to respective electrodes 17a, 17b disposed on the surface of the support portion 6. The electrodes 17a, 17b are electrically connected to an unshown control circuit or the like. The lead conductor 16a is grade-separated from the coil 16 so as to pass above the coil 16.

The coil 18 is wound in a spiral form of multiple turns when viewed from a direction orthogonal to the principal face 82a. One end of the coil 18 is located outside the coil 18 and the other end of the coil 18 inside the coil 18. One end of a lead conductor 18b is electrically connected to an outside end of the coil 18. One end of a lead conductor 18a is electrically connected to an inside end of the coil 18.

The lead conductors 18a, 18b are disposed mainly on the torsion bar portions 14, on the first movable portion 81, and on one torsion bar portion 10 and extend from the second movable portion 82 to the other torsion bar portion 10. The other ends of the lead conductors 18a, 18b are electrically connected to respective electrodes 19a, 19b disposed on the surface of the support portion 6. The electrodes 19a, 19b are electrically connected to the aforementioned unshown control circuit or the like. The lead conductors 18a, 18b are grade-separated from the coil 16 so as to pass above the coil 16.

Figure 4:
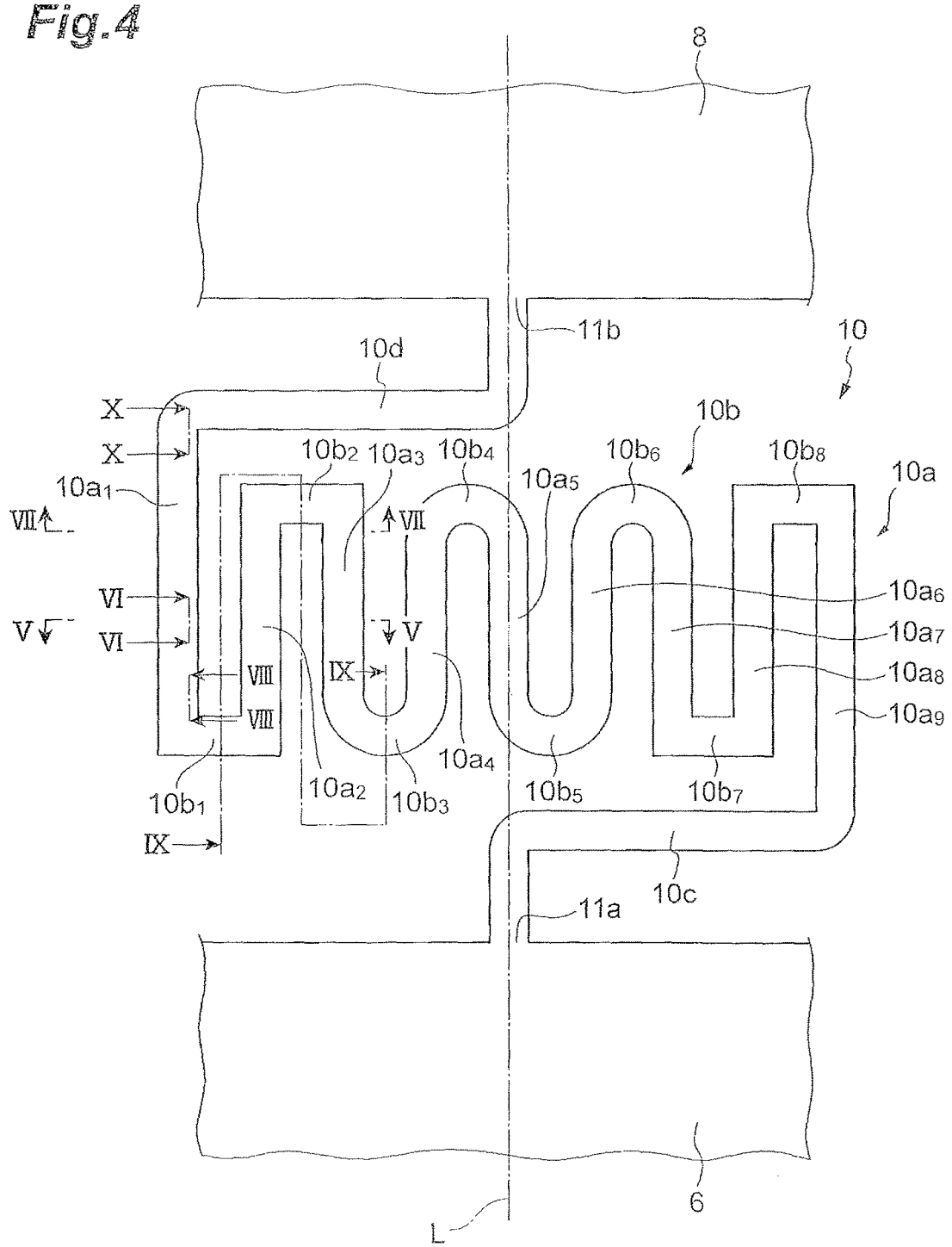
FIG. 4 is a drawing for illustrating a configuration of a torsion bar portion.

Now, let us describe a configuration of each torsion bar portion 10, with reference to FIG. 4. FIG. 4 is a drawing for illustrating the configuration of the torsion bar portion.

As shown in FIG. 4, each torsion bar portion 10 includes a plurality of straight sections 10a (nine straight sections $10a_1$ to $10a_9$ in the present embodiment), a plurality of turnover sections 10b (eight turnover sections $10b_1$ to $10_8$ in the present embodiment), and a pair of connection sections 10c, 10d. The straight sections $10a_1$ to $10a_9$ extend in a first direction along the swing axis L of the torsion bar portion 10 and are juxtaposed in a second direction intersecting with the first direction. The turnover sections $10b_1$ to $10b_8$ are provided so as to extend in the second direction. In the present embodiment, the first direction and the second direction intersect at right angles.

The turnover sections $10b_1$ to $10b_8$ couple ends of two straight sections $10a_1$ to $10a_9$ adjacent in the second direction, out of the straight sections $10a_1$ to $10a_9$. For example, one ends of the respective straight sections $10a_1$ and $10a_2$ are coupled to the turnover section $10b_1$. In this way, the turnover sections $10b_1$ to $10b_8$ alternately couple the two ends of the straight sections $10a_2$ to $10a_8$. In the present embodiment, the turnover sections $10b_1$, $10b_2$, $10b_7$, and $10b_8$ are straight and the turnover sections $10b_3$ to $10_6$ are curved.

The other end of the straight section $10a_1$ is coupled to one end of the connection section 10d. The straight section $10a_1$ is one of the straight sections located outermost in the second direction out of the straight sections $10a_1$ to $10a_9$. The other end of the connection section 10d is coupled to the movable portion 8 at a connection point 11b. Namely, the connection section 10d is connected to the straight section $10a_1$ and to the movable portion 8.

One end of the straight section $10a_9$ is coupled to one end of the connection section 10c. The straight section $10a_9$ is the other of the straight sections located outermost in the second direction out of the straight sections $10a_1$ to $10a_9$. The other end of the connection section 10c is coupled to the support portion 6 at a connection point 11a. Namely, the connection section 10c is connected to the straight section $10a_9$ and to the support portion 6.

The torsion bar portion 10 includes the straight sections $10a_1$ to $10a_9$, the turnover sections $10b_1$ to $10b_8$, and the connection sections 10c, 10d. This makes the torsion bar portion 10 of the meandering shape. The connection points 11a, 11b are located on a virtual line extending in a direction along the swing axis L. The virtual line passes through a central region in the second direction of the torsion bar portion 10.

Figure 5:
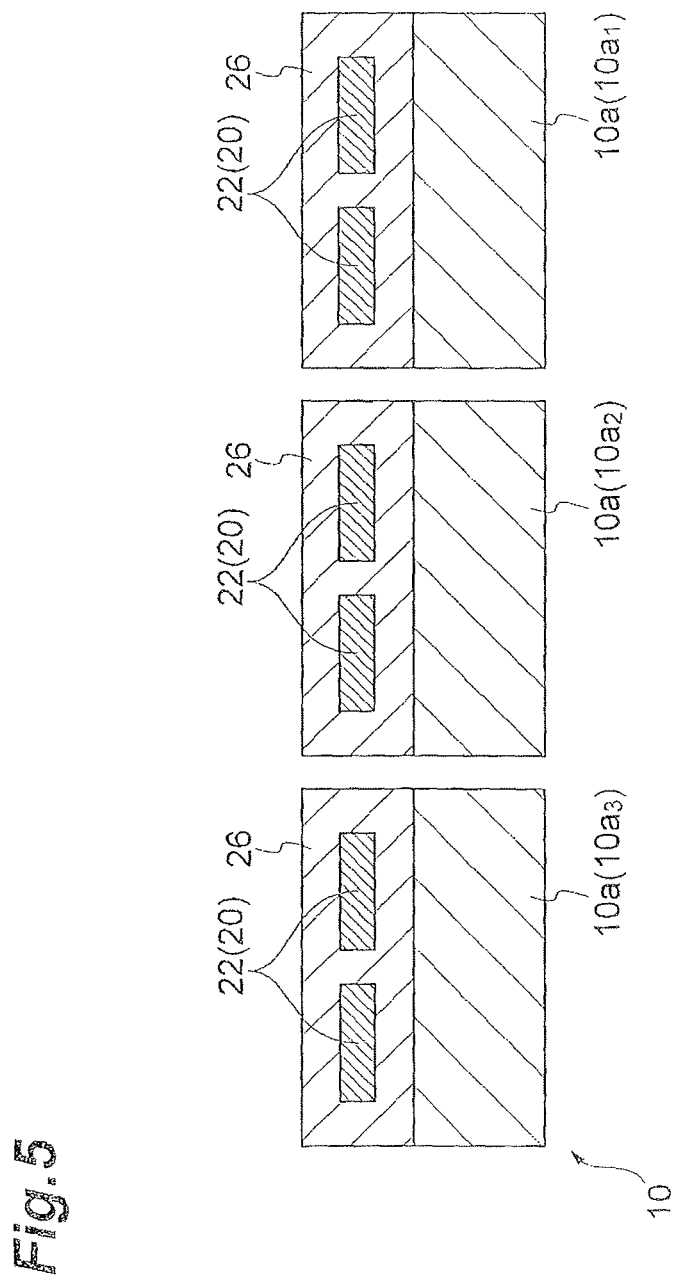
FIG. 5 is a drawing for illustrating a cross-sectional configuration along the line V-V in FIG. 4.
Figure 6:
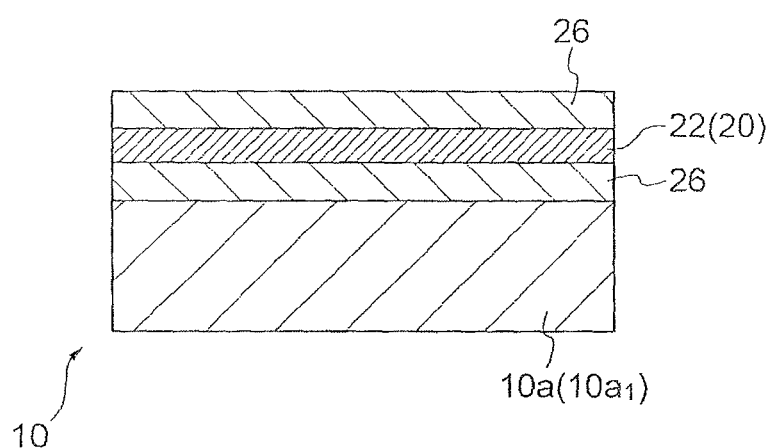
FIG. 6 is a drawing for illustrating a cross-sectional configuration along the line VI-VI in FIG. 4.
Figure 7:
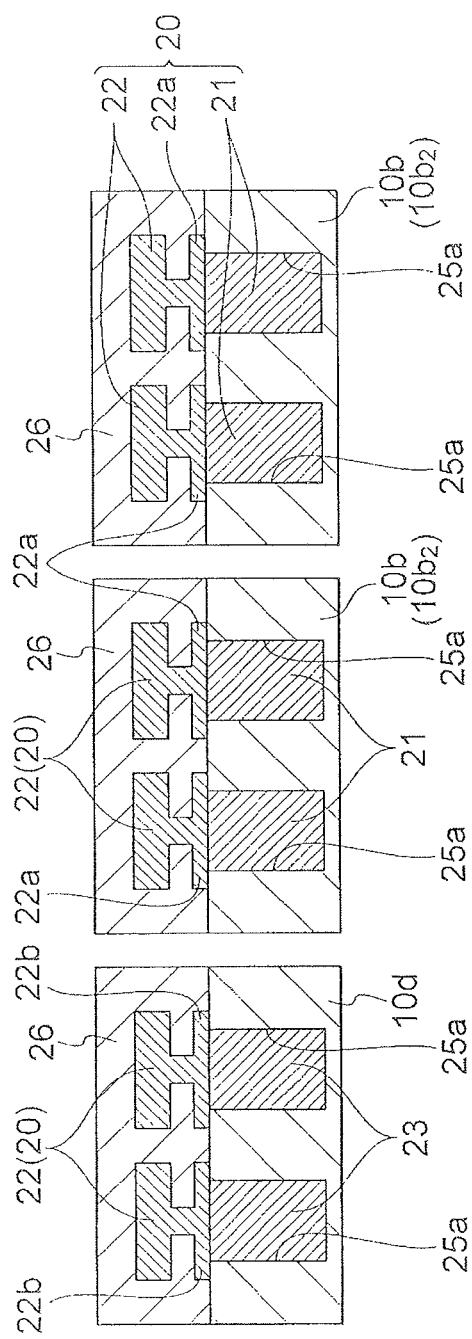
FIG. 7 is a drawing for illustrating a cross-sectional configuration along the line VII-VII in FIG. 4.
Figure 8:
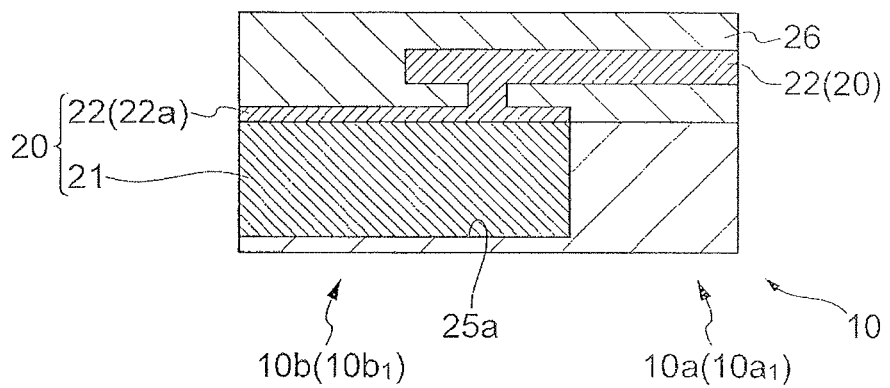
FIG. 8 is a drawing for illustrating a cross-sectional configuration along the line VIII-VIII in FIG. 4.
Figure 9:
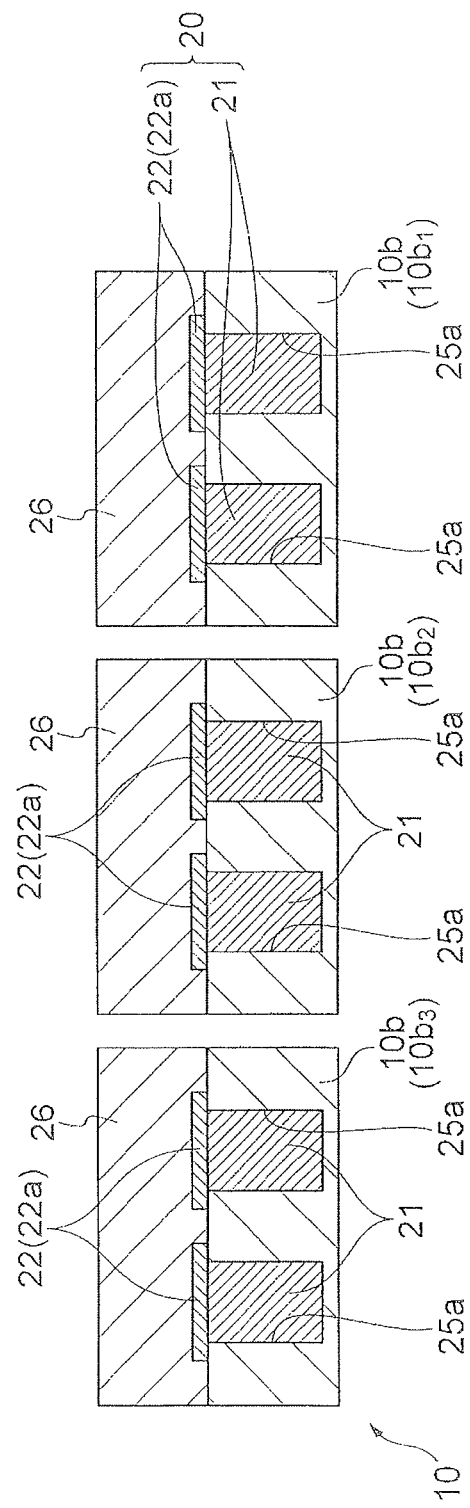
FIG. 9 is a drawing for illustrating a cross-sectional configuration along the line IX-IX in FIG. 4.
Figure 10:
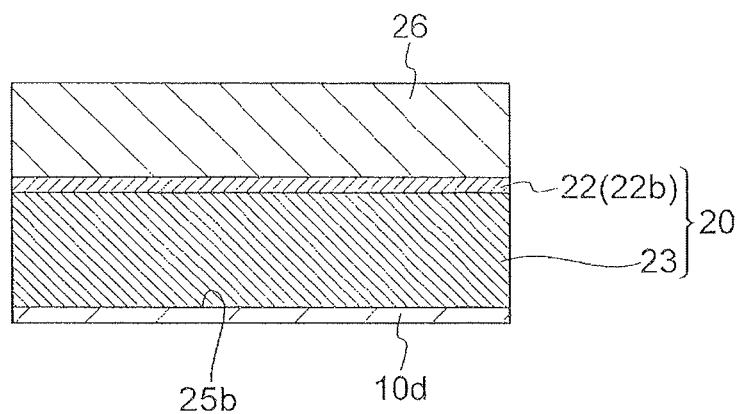
FIG. 10 is a drawing for illustrating a cross-sectional configuration along the line X-X in FIG. 4.

Next, let us describe the wiring 20 disposed on the torsion bar portion 10, with reference to FIGS. 5 to 10. FIG. 5 is a drawing for illustrating a cross-sectional configuration along the line V-V in FIG. 4. FIG. 6 is a drawing for illustrating a cross-sectional configuration along the line VI-VI in FIG. 4. FIG. 7 is a drawing for illustrating a cross-sectional configuration along the line VII-VII in FIG. 4. FIG. 8 is a drawing for illustrating a cross-sectional configuration along the line VIII-VIII in FIG. 4. FIG. 9 is a drawing for illustrating a cross-sectional configuration along the line IX-IX in FIG. 4. FIG. 10 is a drawing for illustrating a cross-sectional configuration along the line X-X in FIG. 4.

The wiring 20 constitutes sections disposed on the corresponding torsion bar portions 10, of the lead conductors 16a, 16b, 18a, 18b. Namely, the lead conductors 16a, 16b, 18a, 18b include the wiring 20. The wiring 20 includes wiring sections 21, wiring sections 22, and wiring sections 23. The wiring sections 21 are disposed on the turnover sections 10b ($10b_1$ to $10b_8$). The wiring sections 22 are disposed mainly on the straight sections 10a ($10a_1$ to $10a_9$). The wiring sections 23 are disposed on the connection sections 10c, 10d. The wiring sections 23 disposed on the connection section 10c are configured in the same configuration as the wiring sections 23 disposed on the connection section 10d. For this reason, the cross-sectional configuration of the wiring sections 23 is shown for only the wiring sections 23 disposed on the connection section 10d, while omitting the illustration of the cross-sectional configuration of the wiring sections 23 disposed on the connection section 10c.

The wiring sections 21, as also shown in FIGS. 7 to 9, are disposed so as to be embedded in grooves 25a formed in the turnover sections 10b. The wiring sections 21 are made of a first metal material including Cu and are formed by the damascene process. Namely, the wiring sections 21 include damascene wiring sections. The grooves 25a are formed by etching the turnover sections 10b. The thickness of the torsion bar portion 10 can be set, for example, approximately in the range of 20 μm to 60 μm. The depth of the grooves 25a can be set, for example, approximately in the range of 5 μm to 15 μm.

The wiring sections 22, as shown in FIGS. 5 and 6, are disposed on the straight sections 10a. Specifically, the wiring sections 22 are disposed in an insulating layer 26 disposed on one principal face of the torsion bar portion 10. The insulating layer 26 is configured so as to partly cover the wiring sections 22. The insulating layer 26 is a thermally-oxidized film obtained by thermally oxidizing the torsion bar portion 10. The insulating layer 26 is made, for example, of silicon oxide ($SiO_2$). The thickness of the insulating layer can be set, for example, to approximately 0.5 μm.

The wiring sections 22 are made of a metal material more resistant to plastic deformation than Cu as the first metal material. The metal material constituting the wiring sections 22 is a metal material more resistant to plastic deformation than Cu; e.g., the metal material is Al or an alloy containing Al. Examples of the alloy containing Al include an Al—Si alloy, an Al—Cu alloy, an Al—Si—Cu alloy, and so on. A composition ratio of the Al—Si alloy can be, for example, Al 99% and Si 1%. A composition ratio of the Al—Cu alloy can be, for example, Al 99% and Cu 1%. A composition ratio of the Al—Si—Cu alloy can be, for example, Al 98%, Si 1%, and Cu 1%. When one of the foregoing metal materials is adopted as the metal material constituting the wiring sections 22, the plastic deformation of the wiring sections 22 can be restrained quite well.

The wiring sections 22 include sections 22a located on the wiring sections 21, as shown in. FIGS. 7 to 9. The sections 22a of the wiring sections 22 are disposed on the wiring sections 21 so as to cover openings of the grooves 25a. The sections 22a of the wiring sections 22 are connected to the wiring sections 21.

As shown in FIG. 7, the wiring sections 21 disposed on the turnover sections 10b are connected to the sections 22a of the wiring sections 22 and the wiring sections 23 disposed on the connection section 10d are connected to sections 22b of the wiring sections 22. In the wiring sections 22 disposed on the straight sections $10a_1$, as shown in FIG. 8, the sections 22a of the wiring sections 22 are connected to the wiring sections 21. The wiring sections 21 are wiring formed by the damascene process. The wiring sections 22 are made, for example, of Al or the alloy containing Al. FIGS. 7 and 8 show changeover regions between the wiring sections 22 disposed on the straight sections 10a and the wiring sections 21 disposed on the turnover sections 10b, in the wiring 20.

The wiring sections 23, as also shown in FIG. 10, are disposed so as to be embedded in grooves 25b formed in the connection section 10d (10c). The wiring sections 23 are made of the first metal material including Cu and formed by the damascene process. Namely, the wiring sections 23 also include damascene wiring sections. The grooves 25b are formed by etching the connection section 10d (10c). The depth of the grooves 25b can be set, for example, approximately in the range of 5 µm to 15 µm.

The wiring sections 22 include sections 22b located on the wiring sections 23, as shown in FIG. 10. The sections 22b of the wiring sections 22 are disposed on the wiring sections 23 so as to cover openings of the grooves 25b. The sections 22b of the wiring sections 22 are connected to the wiring sections 23.

In the present embodiment, the magnetic field generating portion 4 generates a magnetic field with flow of an electric current through the coil 16 and the magnetic field thus generated exerts the Lorentz force in a predetermined direction on electrons flowing in the coil 16. For this reason, the coil 16 is subject to the force in the predetermined direction. By controlling the direction and magnitude of the electric current flowing through the coil 16, the first movable portion 81 swings around the swing axis of the torsion bar portions 10. Namely, the first movable portion 81 rotates back and forth around the rotational axis of the torsion bar portions 10. With flow of an electric current through the coil 18, the magnetic field generating portion 4 generates a magnetic field and the magnetic field thus generated exerts the Lorentz force in a predetermined direction on electrons flowing in the coil 18. For this reason, the coil 18 is subject to the force in the predetermined direction. By controlling the direction and magnitude of the electric current flowing through the coil 18, the second movable portion 82 swings around the swing axis of the torsion bar portions 14. Namely, the second movable portion 82 rotates back and forth around the rotational axis of the torsion bar portions 14. Accordingly, the mirror arrangement portion 83 (minor 3) can be swung around each of the two orthogonal swing axes by controlling each of the directions, magnitudes, and so on of the electric currents through the coil 16 and through the coil 18.

Figure 11:
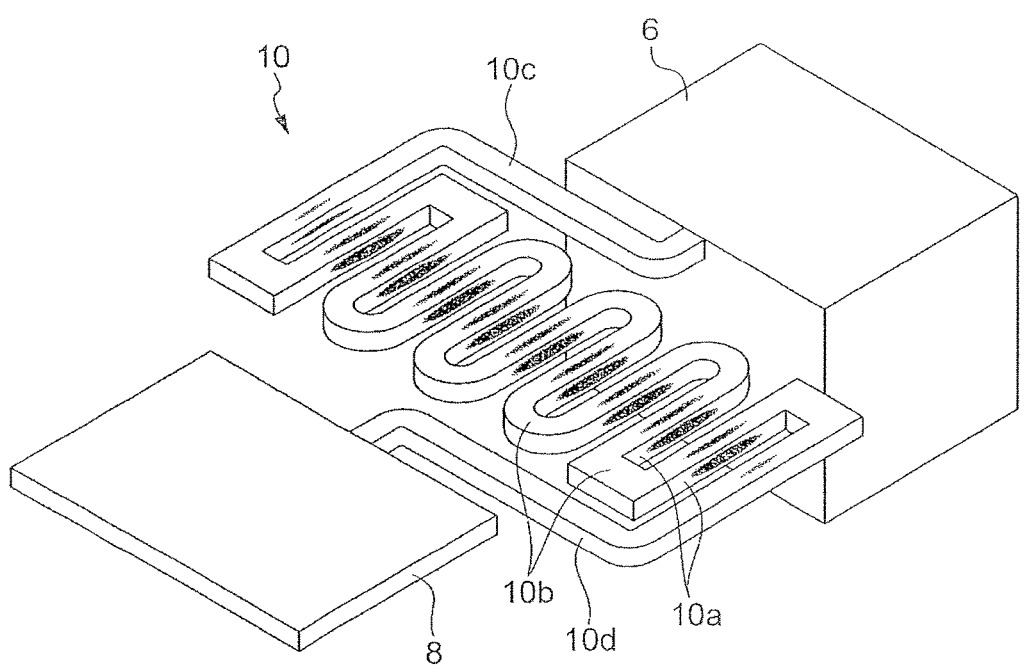
FIG. 11 is a drawing for illustrating a state of stress generated in the torsion bar portion.

Incidentally, when the movable portion 8 (first movable portion 81) swings around the swing axis of the torsion bar portions 10, in each torsion bar portion 10, high stress is exerted on the straight sections 10a extending in the direction along the swing axis of the torsion bar portion 10, as shown in FIG. 11. FIG. 11 is a drawing for illustrating a state of the stress generated in the torsion bar portion 10. FIG. 11 shows the result of a simulation of the stress in the torsion bar portion 10 on the assumption that the support portion 6 is a substantially rectangular parallelepiped shape and that the movable portion 8 (first movable portion 81) is a substantially rectangular flat plate shape. It proved that the high stress is exerted on regions indicated in black in the straight sections 10a extending in the direction along the swing axis of the torsion bar portion 10.

In the present embodiment, the wiring sections 22 disposed on the straight sections 10a are made of Al or the alloy containing Al. For this reason, the wiring sections 22 are restrained from plastic deformation even in the case where the high stress is exerted on the straight sections 10a. Therefore, it is feasible to prevent the wiring 20 disposed on the torsion bar portions 10 from inhibiting the swing motion of the movable portion 8 (first movable portion 81).

In the present embodiment, the wiring sections 21 disposed on the turnover sections 10b are the damascene wiring sections made of Cu. For this reason, it is feasible to achieve reduction in resistance of the wiring 20 disposed on the torsion bar portions 10.

In the present embodiment, not only the wiring sections 21 but also the wiring sections 23 disposed on the connection sections 10e, 10d are the damascene wiring sections made of Cu. For this reason, even in the case where the wiring 20 includes the wiring sections 23, increase in resistance of the wiring is suppressed. As a result, it is feasible to surely achieve reduction in resistance of the wiring 20. The high stress is unlikely to be exerted on the connection sections 10c, 10d, as shown in FIG. 11. Therefore, even if the wiring sections 23 disposed on the connection sections 10c, 10d are the damascene wiring sections made of Cu, the possibility of inhibiting the swing motion of the movable portion 8 (first movable portion 81) is also very low.

The wiring sections 21, 23 are the damascene wiring sections as described above. For this reason, the corner edges located on the surface side of the turnover portions 10b and connection portions 10c, 10d may be locally thinned so as to reduce the sectional area because of steps in their manufacturing process: The decrease in sectional area of the wiring sections 21, 23 leads to increase in total resistance of the wiring 20. However, since the wiring sections 22 include the sections 22a, 22b disposed on the wiring sections 21, 23, the increase in resistance of the wiring 20 can be prevented even if the wiring sections 21, 23 are thinned.

In the present embodiment, the aforementioned sections 22a, 22b are disposed so as to cover the openings of the grooves 25a, 25b. For this reason, Cu of the wiring sections 21, 23 is less likely to diffuse into the insulating layer 26. This suppresses occurrence of a short circuit between the metal materials constituting the wiring sections 21, 23 (Cu in the present embodiment).

In the present embodiment, the connection points 11a, 11b are located on the virtual line extending in the first direction and passing through the central region in the second direction of the torsion bar portion 10. The resonance frequency of the torsion bar portion 10 is determined by the width of the torsion bar portion 10 and the length in the first direction of the torsion bar portion 10. A conceivable configuration to decrease the stress exerted on the straight sections 10a is to increase the number of straight sections 10a. The straight sections 10a are not juxtaposed in the first direction along the swing axis L but juxtaposed in the second direction intersecting with the first direction. For this reason, there is no change in the length in the first direction of the torsion bar portion 10, even with increase in the number of straight sections 10a in the second direction. Therefore, it facilitates design of the torsion bar portion 10 for setting the resonance frequency of the torsion bar portion 10 to a desired value.

In the present embodiment, the resistance of the turnover sections 10b is higher than that of the straight sections 10a, because of their shape. For this reason, increase in the total resistance of the torsion bar portion 10 can be suppressed by disposing the wiring sections 21 formed by the damascene process, on the turnover sections 10b and disposing the wiring sections 22 on the straight sections 10a.

Figure 12:
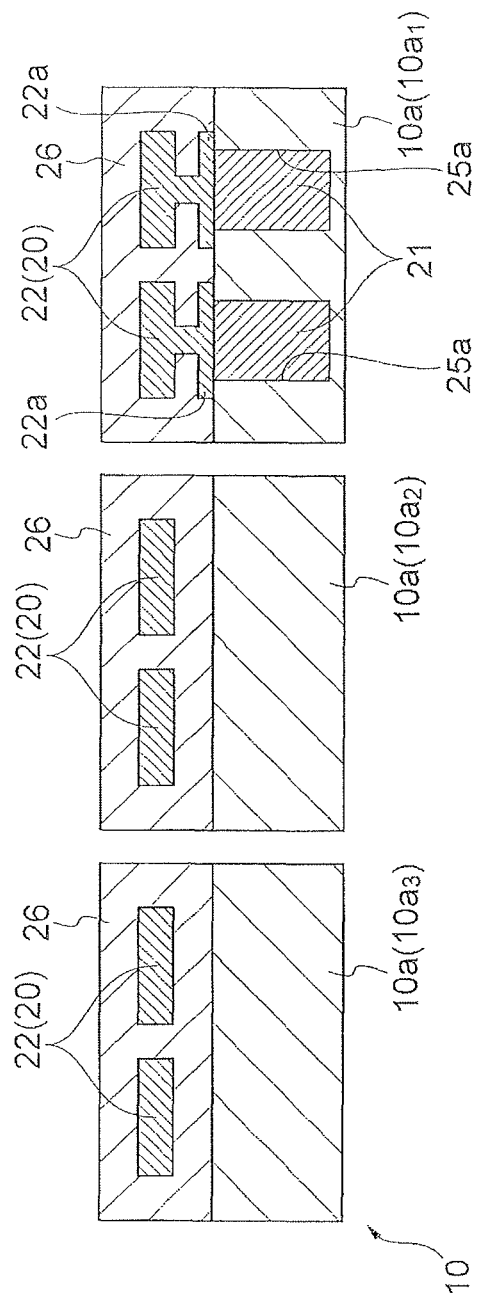
FIG. 12. is a drawing for illustrating a modification example of the configuration of wiring.
Figure 13:
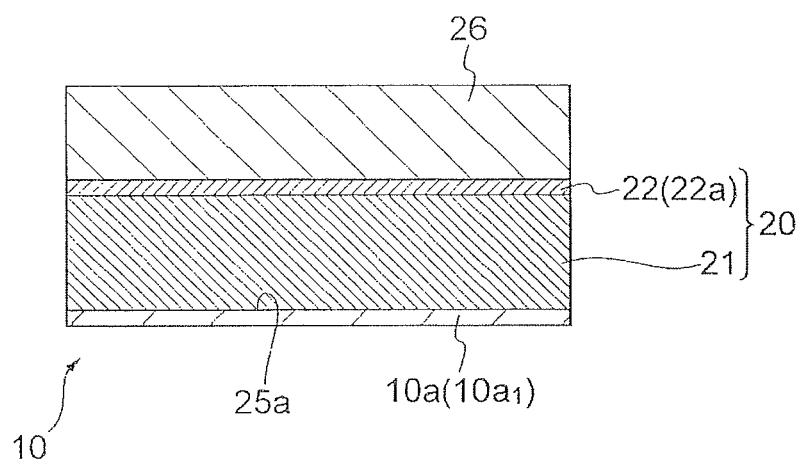
FIG. 13 is a drawing for illustrating the modification example of the configuration of wiring.

In the present embodiment, the wiring sections 22 disposed on the straight sections 10a (straight sections $10a_1$ to $10a_9$) are made of Al or the alloy containing Al, but they do not have to be limited only to it. For example, as shown in FIGS. 12 and 13, the wiring sections 22 do not have to be disposed on all of the straight sections 10a. FIG. 12 is a drawing for illustrating a modification example of the configuration of the wiring, which corresponds to the cross-sectional configuration along the line V-V in FIG. 4. FIG. 13 is a drawing for illustrating the modification example of the configuration of the wiring, which corresponds to the cross-sectional configuration along the line VI-VI in FIG. 4.

As shown in FIGS. 12 and 13, the wiring sections 21 formed by the damascene process may be disposed on the straight sections $10a_1$, $10a_9$ located outermost in the second direction out of the straight sections 10a. As shown in FIG. 11, the stress exerted on the straight sections $10a_1$, $10a_9$ is lower than that exerted on the other straight sections ($10a_2$ to $10a_8$). For this reason, even in the case where the wiring sections 21 are disposed on the straight sections $10a_1$, $10a_9$, the wiring sections 21 disposed on the straight sections $10a_1$, $10a_9$ are less likely to undergo plastic deformation. When the wiring sections 21 are disposed on the straight sections $10a_1$, $10a_9$, the resistance of the wiring 20 can be further reduced.

The wiring sections 21 may also be disposed on the straight sections $10a_2$, $10a_8$. As shown in FIG. 11, the stress exerted on the straight sections $10a_1$, $10a_2$, $10a_8$, $10a_9$ located outside in the second direction out of the straight sections 10a is lower than that exerted on the straight sections $10a_3$ to $10a_7$ closer to the swing axis L. For this reason, even in the case where the wiring sections 21 are disposed on the straight sections $10a_1$, $10a_2$, $10a_8$, $10a_9$, the wiring sections 21 disposed on the straight sections $10a_1$, $10a_2$, $10a_8$, $10a_9$ are less likely to undergo plastic deformation. When the wiring sections 21 are disposed on the straight sections $10a_1$, $10a_2$, $10a_8$, $10a_9$, the resistance of the wiring 20 can be further reduced, The embodiment of the present invention has been described above, but it should be noted that the present invention is not always limited to the foregoing embodiment but can be modified.

In the aforementioned embodiment, the turnover sections $10b_1$, $10b_2$, $10b_7$, and $10b_8$ were straight while the turnover sections $10b_3$ to $10_6$ were curved, but they do not have to be limited to this. The turnover sections 10b all may be straight, or, all may be curved. The turnover sections 10b may be an arbitrary combination of straight and curved shapes or may be different shapes.

In the foregoing embodiment, the torsion bar portion 10 was of the meandering shape consisting of the nine straight sections 10a ($10a_1$ to $10a_9$) and eight turnover sections 10b ($10b_1$ to $10b_8$), but the numbers of straight sections 10a and turnover sections 10b do not have to be limited to them.

The above embodiment was described using the example where the mirror 3 and mirror arrangement portion 83 were of the circular shape, but the shape of the mirror 3 and mirror arrangement portion 83 may be, for example, a polygonal shape or an elliptical shape or the like.

The actuator device 2 may be an actuator device for driving a member except for the mirror 3.

The above embodiment had the configuration in which only the torsion bar portions 10 were of the meandering shape and the wiring 20 was disposed on the torsion bar portions 10, but the present invention does not have to be limited only to it. For example, the torsion bar portions 10, 14 may be of the meandering shape and the wiring 20 may be disposed thereon. Only the torsion bar portions 14 may be of the meandering shape and the wiring 20 may be disposed on the torsion bar portions 14.

More preferably, the torsion bar portions 10 are of the meandering shape and the wiring 20 is disposed on the torsion bar portions 10. The stress on the torsion bar portions 14 is stress exerted during the swing motion of the second movable portion 82. The stress on the torsion bar portions 10 is stress exerted during the swing motion of the first movable portion 81 and the second movable portion 82. Namely, the stress on the torsion bar portions 14 is lower than that on the torsion bar portions 10. For this reason, the torsion bar portions 14 are less likely to pose the problem due to the stress than the torsion bar portions 10. Therefore, the structure of the torsion bar portions 14 can be the simple configuration, which can increase a yield in manufacture of the actuator device 2.

In the present embodiment, the movable portion 8 is configured so as to be driven in the two axis directions, the swing axis of the torsion bar portions 10 and the swing axis of the torsion bar portions 14, but the present invention is not limited only to it. For example, the actuator device 2 may be configured so as to be driven by one coil disposed on a movable portion. The actuator device 2 may be preferably configured so that the lead conductors are disposed on the pair of respective torsion bar portions. Since the lead conductors are disposed on the torsion bar portions, whether the torsion bar portions are damaged can be known by the presence or absence of an electric current flowing in the lead conductors. The actuator device 2 may be configured by adopting a configuration in which the operation of the actuator device is suspended with detection of the damage.

In the case where the lead conductors are disposed on the pair of respective torsion bar portions, the number of grooves formed in the torsion bar portions is smaller than in the case where the lead conductors are disposed on only one torsion bar portion of the pair of torsion bar portions. For this reason, the stress on the torsion bar portions can be reduced. Furthermore, since the wiring disposed on each torsion bar portion is one wire, it can prevent a short circuit between wires.

In the present embodiment, the swing motion (drive) of the movable portion 8 is implemented by electromagnetic force, but the present invention does not have to be limited only to it. For example, the swing motion (drive) of the movable portion 8 may be implemented by a piezoelectric device. In this case, the wiring 20 is used as wiring for applying a voltage to the piezoelectric device.

REFERENCE SIGNS LIST

1 mirror driving device; 2 actuator device; 3 mirror; 4 magnetic field generating portion; 6 support portion; 8 movable portion; 10, 14 torsion bar portions; 10a ($10a_1$ to $10a_9$) straight sections; 10b ($10b_1$ to $10b_8$) turnover sections; 10c, 10d connection sections; 16, 18 coils; 20 wiring; 21, 22, 23 wiring sections; L swing axis.

The invention claimed is:

1. An actuator device comprising:
    a support portion;
    a first movable portion;
    a first torsion bar portion coupling the first movable portion to the support portion to be swingable around a first swing axis; and
    a wiring disposed on the first torsion bar portion,
    wherein the torsion bar portion is of a meandering shape including a plurality of straight sections extending in a first direction along the first swing axis and juxtaposed in a second direction intersecting with the first direction, and a plurality of turnover sections alternately coupling two ends of the straight sections, the plurality of turnover sections have a curved shape, the wiring includes wiring sections embedded in grooves formed in the turnover sections, and the grooves are formed in a substrate in which the support portion, the first movable portion, and the first torsion bar portion are integrally formed, at positions corresponding to the turnover sections.

2. The actuator device according to claim 1, wherein the plurality of straight sections includes a first straight section disposed on the first swing axis, at least one second straight section disposed on one side of the first straight section in the second direction, and at least one third straight section disposed on another side of the first straight section in the second direction, and the numbers of the second straight section and the third straight section are the same.

3. The actuator device according to claim 1, wherein the turnover section located near the first swing axis has a larger curvature than the turnover section located away from the first swing axis.

4. The actuator device according to claim 1, wherein the first torsion bar portion includes a first connection section that connects the support portion to one straight section located outermost in the second direction out of the plurality of straight sections, and a second connection section that connects the movable section to the other straight section located outermost in the second direction out of the plurality of straight sections, and a portion of the first connection section that opposes the corresponding turnover section has a curved shape, and a portion of the second connection section that opposes the corresponding turnover section has a curved shape.

5. The actuator device according to claim 1, further comprising:

a second movable portion; and a second torsion bar portion that couples the second movable portion to the first movable portion to be swingable around a second swing axis intersecting with the first swing axis.

6. The actuator device according to claim 5, wherein the second torsion bar portion and the second movable portion are coupled in a curved manner.

7. The actuator device according to claim 5, further comprising:

a mirror arrangement portion coupled to the second movable portion at least in a direction orthogonal to the second swing axis.

8. The actuator device according to claim 5, wherein the second movable portion includes a first portion extending in a direction orthogonal to the second swing axis and a second portion extending in a direction parallel to the second swing axis, and a width of the first portion in the direction parallel to the second swing axis is larger than a width of the second portion in the direction orthogonal to the second swing axis.

9. The actuator device according to claim 1, wherein the wiring sections are disposed in regions defined by bottom surfaces of the grooves and side surfaces of the grooves.

* * * * *